(12) United States Patent
Saito et al.

(10) Patent No.: US 7,098,120 B2
(45) Date of Patent: Aug. 29, 2006

(54) METHOD OF MANUFACTURING SEMICONDUCTOR DEVICES

(75) Inventors: Tomohiro Saito, Tokyo (JP); Kyoichi Suguro, Tokyo (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 10/770,520

(22) Filed: Feb. 4, 2004

(65) Prior Publication Data

US 2005/0095825 A1 May 5, 2005

(30) Foreign Application Priority Data

Oct. 30, 2003 (JP) .......................... P2003-370755

(51) Int. Cl.
    *H01L 21/425* (2006.01)
(52) U.S. Cl. ............... 438/527; 438/530; 257/E21.135; 257/E21.057
(58) Field of Classification Search ........ 257/E21.135, 257/E21.057; 438/527, 530, 659
See application file for complete search history.

(56) References Cited

U.S. PATENT DOCUMENTS

| | | | | |
|---|---|---|---|---|
| 5,569,624 A | * | 10/1996 | Weiner ..................... | 438/285 |
| 5,654,242 A | * | 8/1997 | Komatsu ................... | 438/585 |
| 5,744,398 A | * | 4/1998 | Byun et al. ............... | 438/592 |
| 5,827,762 A | * | 10/1998 | Bashir et al. ............. | 438/202 |
| 5,960,270 A | * | 9/1999 | Misra et al. .............. | 438/197 |
| 6,376,888 B1 | * | 4/2002 | Tsunashima et al. ...... | 257/407 |
| 2003/0201499 A1 | * | 10/2003 | Hiroshi ..................... | 257/368 |
| 2005/0142818 A1 | * | 6/2005 | Nakamura et al. ......... | 438/486 |

FOREIGN PATENT DOCUMENTS

| | | |
|---|---|---|
| JP | 57-050427 | 3/1982 |
| JP | 59-114868 | 7/1984 |
| JP | 9-082958 | 3/1997 |
| JP | 10-303410 | 11/1998 |
| JP | 2000-315789 | 11/2000 |
| JP | 2001-203276 | 7/2001 |

OTHER PUBLICATIONS

Notification of Reasons for Rejection issued by the Japanese Patent Office on May 30, 2006, for Japanese Patent Application No. 2000-300446, and English-language translation thereof.

* cited by examiner

*Primary Examiner*—Caridad Everhart
(74) *Attorney, Agent, or Firm*—Finnegan, Henderson, Farabow, Garrett & Dunner, L.L.P.

(57) ABSTRACT

A method of manufacturing semiconductor devices includes forming element isolation regions in a semiconductor substrate, a gate insulation film in an element region surrounded by the element isolation regions and an impurity doped metal silicide film on the gate insulation film; irradiating energy beams to heat the silicide film; forming a gate electrode film by patterning the silicide film; and forming source and drain regions by doping an impurity into said element region by using at least the gate electrode film as a mask.

13 Claims, 14 Drawing Sheets

METHOD OF MANUFACTURING
SEMICONDUCTOR DEVICES

FIELD OF THE INVENTION

This invention generally relates to a method of manufacturing semiconductor devices and, more particularly, to a method of manufacturing metal insulator semiconductor field effect transistors with silicide film gates.

This application is based upon and claims the benefit of priority from the prior Japanese Patent Application No. 2003-370755, filed on Oct. 30, 2003, the entire contents of which are incorporated herein by reference.

BACKGROUND OF THE INVENTION

Metal insulator semiconductor field effect transistor ("MISFET") devices are contained in an integrated circuit as basic devices. A miniaturization technique is applied to a MISFET device to shorten its channel length in order to make an operation speed of the integrated circuit high. Since gate insulation and electrode films are also made thinner with the miniaturization, their materials conventionally used for the high speed operation are reaching limits. Thus, new materials, and new device structures and manufacturing methods in which such new materials are applied have been developed.

Polycrystalline silicon, for example, generally used for a gate electrode material is high in resistivity. Metal or silicide is employed instead. When such a material is applied to an integrated circuit consisting of complementary metal oxide semiconductor ("CMOS") circuits, for example, gate electrodes of N-channel and P-channel MISFET devices are made from identical materials so that the work functions of both gate electrodes become equal. Thus, it is extremely difficult to control proper threshold voltages of the N-channel and P-channel MISFET devices required for circuit operations, respectively.

To avoid this difficulty, a method of controlling the work function has been proposed in Japanese Patent Disclosure 2001-20376, page 15, FIG. 1. In the method, TiN, for example, is used to form a gate electrode film and a composition rate of the TiN electrode for an N-channel MISFET is changed by implanting nitrogen ions into the electrode. The method can control properly threshold voltages of the N-channel and P-channel MISFET devices, respectively.

The proposed method, however, has unstable factors as a method of manufacturing semiconductor devices. Such unstable factors are that heating treatment required after forming the gate electrode film causes deterioration of a withstand voltage of the gate electrode and that the generation of interface states results in reduction of driving capability of the gate electrode.

SUMMARY OF THE INVENTION

The first aspect of the present invention is characterized in that a method of manufacturing semiconductor devices comprises the steps of forming element isolation regions in a semiconductor substrate, forming a gate insulation film in an element region surrounded by the element isolation regions, forming a silicide film on the gate insulation film, irradiating energy beams to heat the silicide, patterning the silicide to form a gate electrode film, and doping an impurity into the element region to form source and drain regions by using at least the gate electrode film made by the patterning step as a mask.

The second aspect of the present invention is characterized in that a method of manufacturing semiconductor devices comprises the steps of forming element isolation regions in a semiconductor substrate, forming a dummy gate insulation film in an element region surrounded by the element isolation regions, forming a dummy gate electrode film on the dummy gate insulation film, patterning the dummy gate electrode film to form a dummy gate electrode, forming extension regions by doping an impurity into the element region by using the dummy gate electrode film as a mask, forming a sidewall insulation film on a side surface of the dummy gate electrode film, doping an impurity into the element region to form source and drain regions by using the dummy gate electrode film as a mask which is provided with the sidewall insulation, covering the source and drain regions and the dummy gate with an interlayer insulation film, making the interlayer insulation film substantially even to expose the dummy gate electrode, eliminating the dummy gate electrode and the dummy gate insulation film to define a space, forming a gate insulation film in the space on the semiconductor substrate, forming a silicide film on the gate insulation film, and irradiating energy beams to heat the silicide.

The third aspect of the present invention is characterized in that a method of manufacturing semiconductor devices comprises the steps of forming element isolation regions in a semiconductor substrate, forming first conductive type and second conductive type MISFET regions surrounded by the element isolation regions, forming gate insulation films in the first conductive type and second conductive type MISFET regions, forming silicide films on the gate insulation films, doping a first conductive type impurity into the silicide in the first conductive type MISFET region, irradiating energy beams to heat the silicide into which the first conductive type impurity is doped, patterning the silicide films to form gate electrodes, and doping first conductive type and second conductive type impurities into the first conductive type and second conductive type MISFET devices to form source and drain regions by using at least the patterned gate electrode films as a mask.

The fourth aspect of the present invention is characterized in that a method of manufacturing semiconductor devices comprises the steps of forming element isolation regions in a semiconductor substrate, forming first conductive type and second conductive type well regions surrounded by the element isolation regions to make second conductive type and first conductive type MISFET regions, forming dummy gate insulation films in the first conductive type and second conductive type MISFET regions, forming dummy gate electrode films on the dummy gate insulation films, patterning the dummy gate electrode films to make dummy gate electrodes, doping first conductive type and second conductive type impurities into the first conductive type and second conductive type metal insulator field effect transistors, respectively, to form extension regions by using the dummy gate electrode as a mask, forming a sidewall insulation film on a sidewall of the dummy gate electrode, doping first conductive type and second conductive type impurities into the first conductive type and second conductive type metal insulator field effect transistors, respectively, to form source and drain regions by using the dummy gate electrode as a mask on the sidewall of which the sidewall insulation is formed, covering the source and drain regions and the dummy gate with an interlayer insulation film, making the interlayer insulation film substantially even to expose the dummy gate electrode, eliminating the dummy gate electrode and the dummy gate insulation film to define a space, forming a gate insulation film in the space on the semiconductor substrate, forming a silicide film on the gate insulation film, doping a first conductive type impurity into the silicide in the first conductive type MISFET region, and irradiating energy beams to heat the silicide into which the first conductive type impurity is doped.

BRIEF DESCRIPTION OF THE DRAWINGS

A more complete appreciation of the present invention and many of its attendant advantages will be readily obtained as the same becomes better understood by reference to the following detailed descriptions when considered in connection with the accompanying drawings, wherein.

DETAILED DESCRIPTION OF THE INVENTION

Figure 1A:
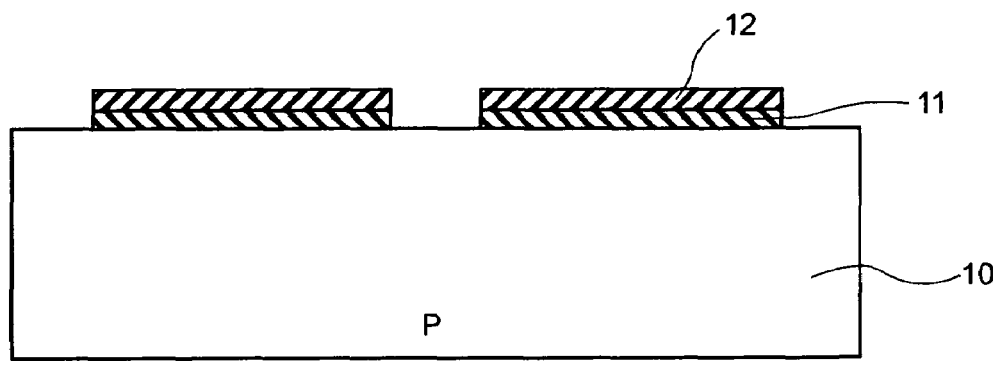
FIGS. 1A–1M are schematically cross-sectional views to explain a series of processes of a method of manufacturing semiconductor devices in accordance with the first embodiment of the present invention.

Embodiments of the present invention will be explained below with reference to the attached drawings. It should be noted that the present invention is not limited to the embodiments but covers their equivalents. Throughout the attached drawings, similar or same reference numerals show similar, equivalent or same components. The drawings, however, are shown schematically for the purpose of explanation so that their components are not necessarily the same in shape or dimension as actual ones. In other words, concrete shapes or dimensions of the components should be considered as described in these specifications, not in view of the ones shown in the drawings. Further, some components shown in the drawings may be different in dimension or ratio from each other.

FIRST EMBODIMENT

Manufacturing processes to form element isolation regions in a semiconductor substrate will be explained below with reference to FIGS. 1A–1C to begin with.

Figure 1B:
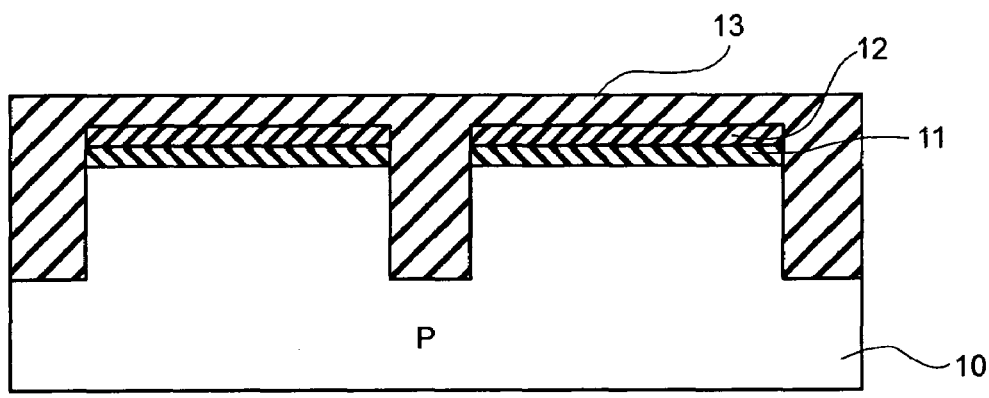

As shown in FIG. 1A, the first and second insulation films 11 and 12 are, in turn, formed on a P-type silicon semiconductor substrate 10. Insulation films 11 and 12 are made from silicon oxide and silicon nitride, for example, respectively. Subsequently, lithography and etching methods are applied to selectively etch the first and second insulation films 11 and 12 to make a mask pattern.

Next, dry etching is carried out to make shallow trenches in silicon substrate 10 while the first and second insulation films 11 and 12 are used as a mask. As shown in FIG. 1B, a silicon oxide film, for example, is deposited as the third insulation film 13 by applying a chemical vapor deposition ("CVD") method, and it is filled in the trenches and covers the second insulation film 12 on substrate 10.

An etching method is then applied to eliminate the third insulation film 13, and the first and second insulation films 11 and 12 used as the mask from silicon substrate 10 while a chemical mechanical polishing ("CMP") method is employed to make the surface of substrate 10 even. As shown in FIG. 1C, element isolation regions 14 of shallow trenches filled with the third insulation film 13 are formed.

Figure 1C:
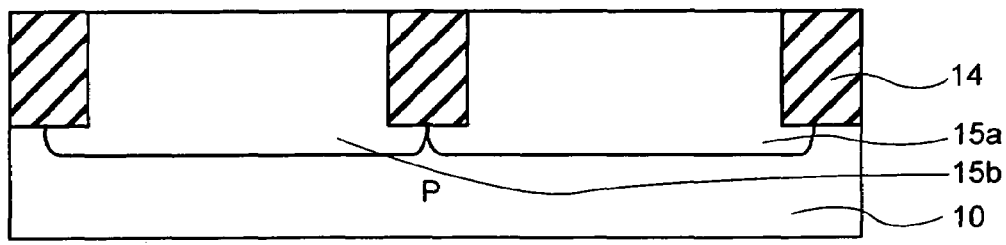

Next, as shown in FIG. 1C, by applying an ion implantation method, phosphorus as an N-type impurity is implanted into a P-channel MISFET region to form N-type well region 15a. Boron as a P-type impurity is implanted into an N-channel MISFET region to form P-type well region 15b. Dosed amounts of phosphorus and boron are approximately 1E12 cm$^{-2}$ and 1E13 cm$^{-2}$. After that, rapid heating treatment at a temperature of 900° C. for 10 sec., for example, is carried out to activate the implanted impurities. This results in forming P-channel and N-channel MISFET regions in a CMOS circuit structure.

Now, manufacturing processes to form a dummy gate structure will be explained below with reference to FIGS. 1D–1F.

First, an approximately 10 nm silicon oxide film (not shown) is formed on silicon substrate 10. Electrically conductive impurity ions are implanted into silicon substrate 10 through the silicon oxide film to control a threshold voltage of a MISFET device. That is, an ion implantation method is applied to selectively implant arsenic of an N-type impurity and boron of a P-type impurity into N-type and P-type wells 15a and 15b, respectively. Dosed amounts of arsenic and boron each are approximately 1E13 cm$^{-2}$ to 1E14 cm$^{-2}$. After that, rapid heating treatment at a temperature of 900° C. for 10 sec., for example, is carried out to activate the implanted impurities.

Figure 1D:
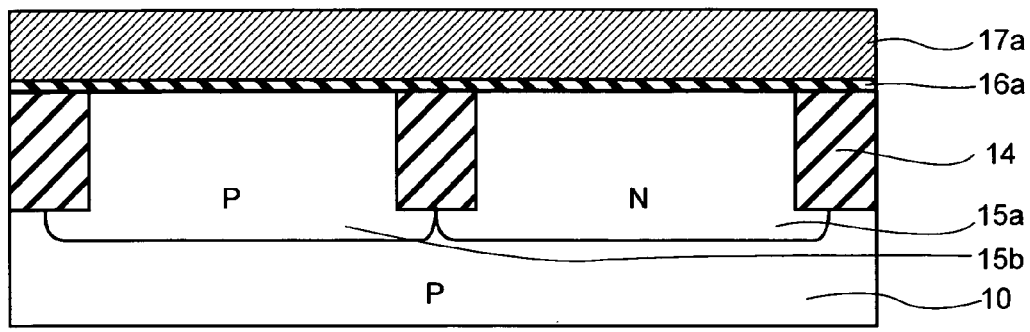

Subsequently, as shown in FIG. 1D, silicon substrate 10 is thermally oxidized in an oxide atmosphere at temperatures ranging from 800° C. to 900° C. to form a thermal oxidation film for dummy gate insulation film 16a with a thickness of about 8 nm. Further, by applying a CVD method, a polycrystalline silicon film is grown to be about 100 nm in thickness, for example, as dummy gate electrode film 17a on dummy gate insulation film 16a.

Figure 1E:
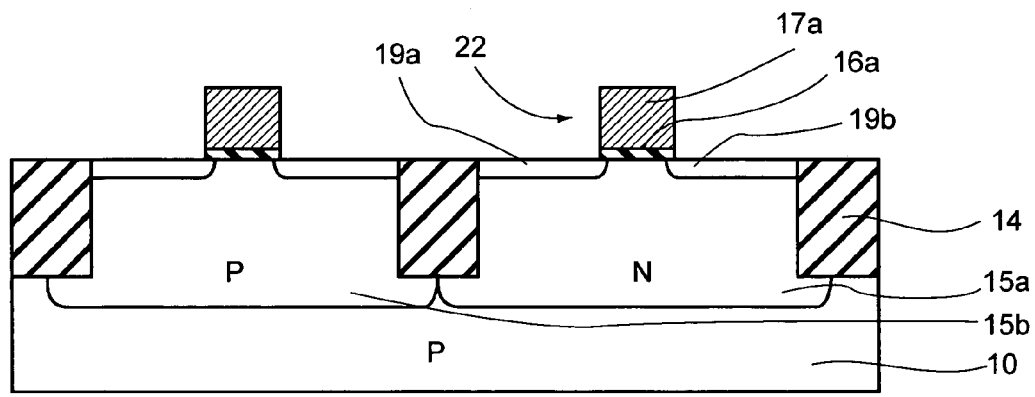

Next, lithography and dry etching methods are carried out to selectively etch dummy gate electrode film 17a and dummy gate insulation film 16a so that dummy gate structure 22 is formed on silicon substrate 10 as shown in FIG. 1E. Further, an ion implantation method is applied to form extension regions 19a and 19b by using dummy gate electrode film 17a as a mask. In other words, ion implantations are carried out to selectively implant boron of a P-type impurity and arsenic of an N-type impurity into extension regions 19a and 19b, respectively. Dosed amounts of boron and arsenic each are approximately 1E13 cm$^{-2}$ to 1E15 cm$^{-2}$. After that, rapid heating treatment at a temperature of 900° C. for 10 sec., for example, is carried out to activate the implanted impurities. Alternatively, after dummy gate electrode film 17a is subject to etching treatment and extension regions 19a and 19b are formed, dummy gate insulation film 16a may be etched.

Figure 1F:
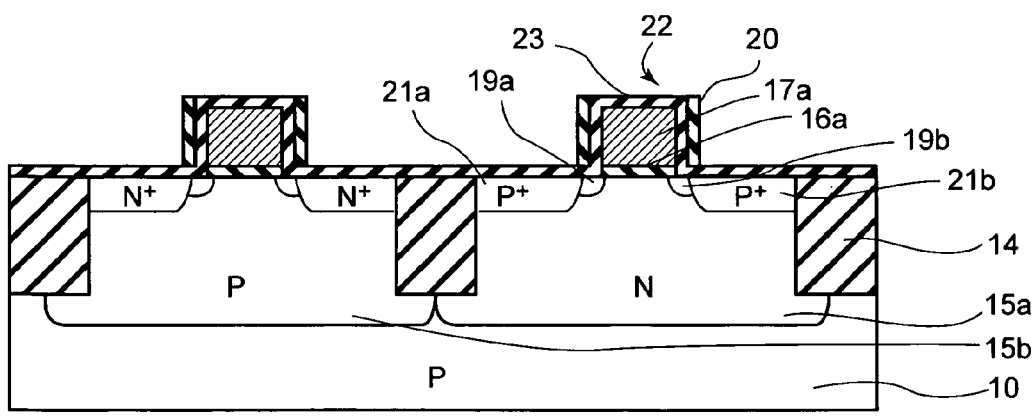

Next, as shown in FIG. 1F, a CVD method is applied to form a silicon nitride film as liner insulation layer 23 covering the surface of silicon substrate 10. The silicon nitride film is 20 nm to 40 nm in thickness. In addition, a silicon oxide film, for example, is formed. A dry etching is then carried out to eliminate the silicon oxide film on silicon substrate 10 and the top surface of dummy gate structure 22 only so that the silicon oxide film selectively remains to form sidewall insulation film 20 around the circumference of dummy gate structure 22.

Subsequently, an ion implantation method is applied to implant ions through a mask consisting of dummy gate structure 22 and sidewall insulation film 20 so that source and drain regions 21a and 21b are formed. More particularly, boron of a P-type impurity and arsenic of an N-type impurity are selectively implanted into N-type well region 15a and P-type well region 15b, respectively. Dosed amounts of boron and arsenic each are approximately 1E15 cm$^{-2}$ to 1E16 cm$^{-2}$. After that, rapid heating treatment at a temperature of 900° C. for 10 sec., for example, is carried out to activate the implanted impurities.

Figure 1G:
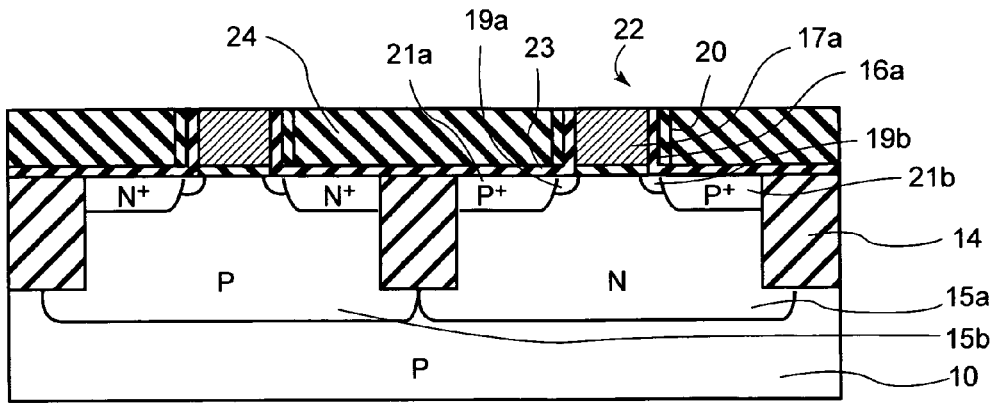

A CVD method is then applied to form silicon oxide film 24 covering silicon substrate 10. After that, CMP and etching methods are carried out to remove silicon oxide film 24 and expose the surfaces of dummy gate electrode film 17a and sidewall insulation film 20. As shown in FIG. 1G, the surface is made even and silicon oxide film 24 remains selectively to be an interlayer insulation film.

Figure 1H:
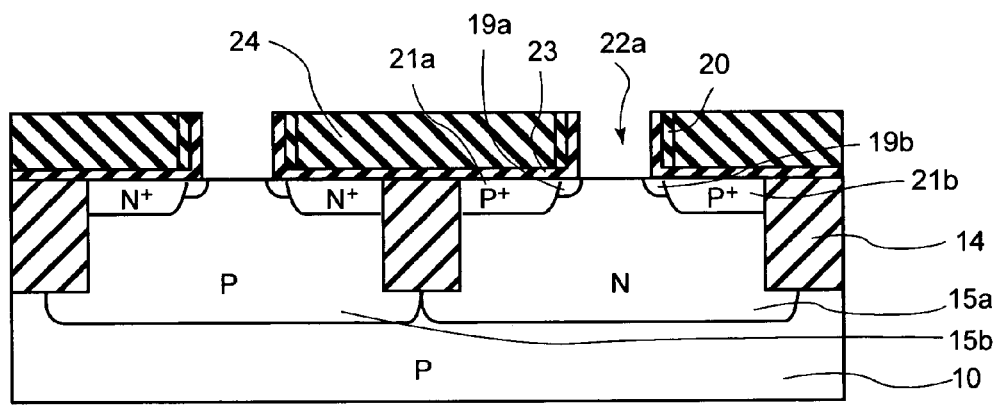

As shown in FIG. 1H, an etching method employing radicals of halogen atoms, such as those of fluorine atoms, is applied to selectively remove dummy gate electrode film 17a consisting of poly-crystalline silicon from silicon oxide interlayer insulation film 24 and sidewall insulation film 20. Further, diluted hydrofluoric acid, for example, is used to eliminate dummy gate insulation films 16a and to form space regions 22a in which a gate insulation film and a gate electrode are provided as explained below.

Figure 1I:
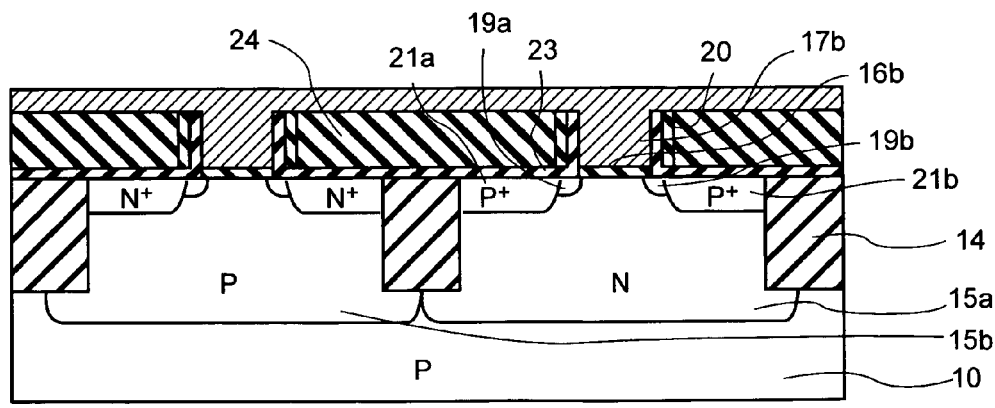

Next, as shown in FIG. 1I, a thermal oxidation method is carried out to form a silicon oxide film as gate insulation film 16b in space regions 22a on silicon substrate 10. Subsequently, a CVD method or a sputtering method is employed to form gate electrode film 17b of a silicide film, such as a WSi$_2$ film having a thickness of about 100 nm thickness. Gate electrode film 17b is filled in space region 22a and is formed on silicon substrate 10 as well.

Further, in order to control the work function of gate electrode film 17b, impurities are doped into gate electrode film 17b of P-channel and N-channel MISFET forming regions, respectively. Thus, gate electrode film 17b becomes an impurity doped silicide film.

Figure 1J:
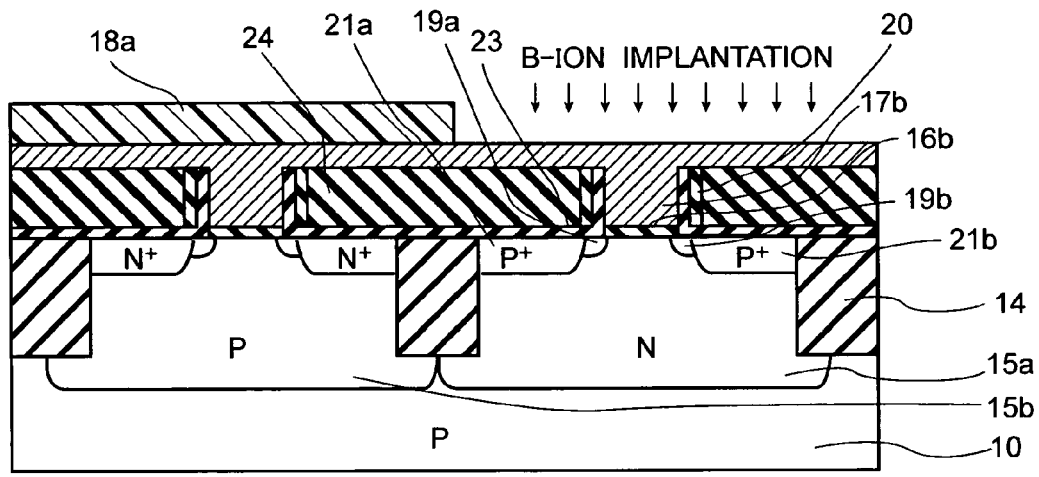

As shown in FIG. 1J, a lithography method is applied to selectively cover gate electrode film 17b on P-type well region 15b formed in the N-channel MISFET forming region with the first photoresist film 18a. An ion implantation method is carried out to implant boron of a P-type impurity into gate electrode film 17b on N-type well region 15a formed in the P-channel MISFET forming region. A dosed amount of boron is about 1E15 cm$^{-2}$ to 1E16 cm$^{-2}$. The first photoresist film 18a is then removed.

Figure 1K:
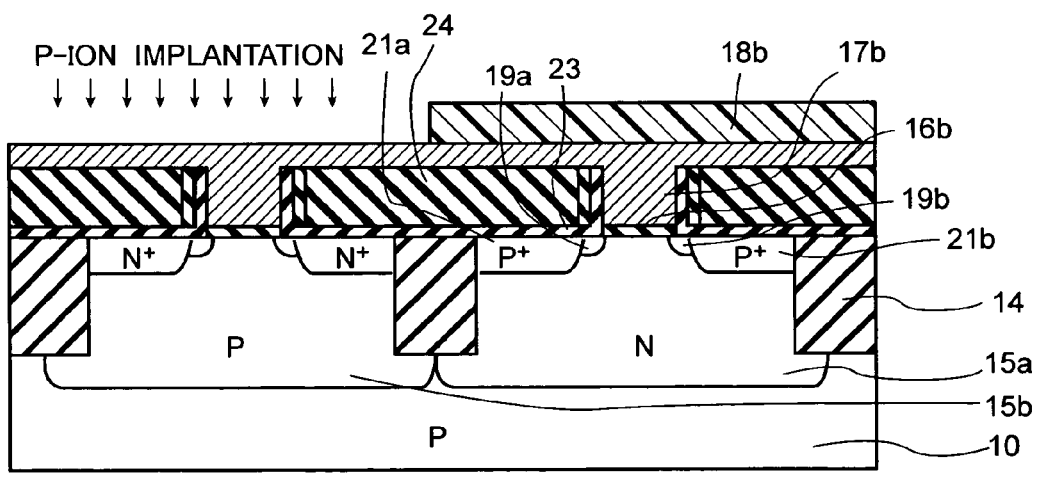

Further, as shown in FIG. 1K, a lithography method is used to cover gate electrode film 17d on N-type well region 15a formed in the P-channel MISFET forming region with the second photoresist film 18b. An ion implantation method is carried out to implant phosphorus of an N-type impurity into gate electrode film 17b on P-type well region 15b formed in the N-channel MISFET forming region. A dosed amount of phosphorus is about 1E15 cm$^{-2}$ to 1E16 cm$^{-2}$. The second photoresist film 18b is then removed.

Figure 1L:
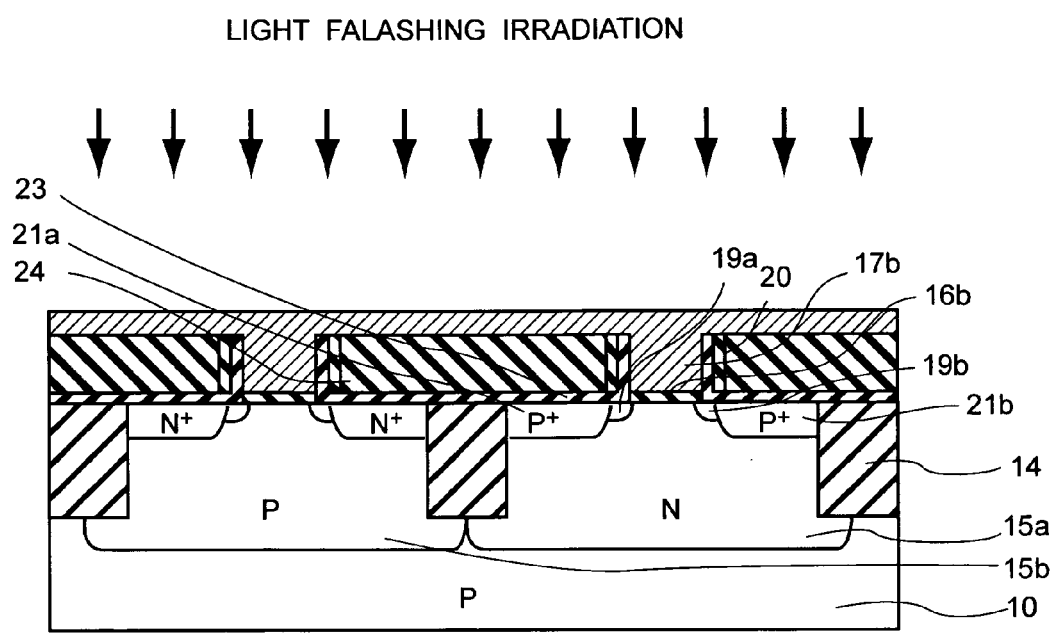

Next, as shown in FIG. 1L, a flash lamp annealing method is carried out to diffuse the boron of a P-type impurity with respect to silicon and the phosphorus of an N-type impurity with respect to silicon. Silicon substrate 10 is heated at a temperature of 550° C. and is irradiated with incoherent light beams for 10 msec. to 100 msec. By using such a flash lamp annealing method, only gate electrode film 17b of WSi$_2$ is effectively heated at a high temperature.

Figure 1M:
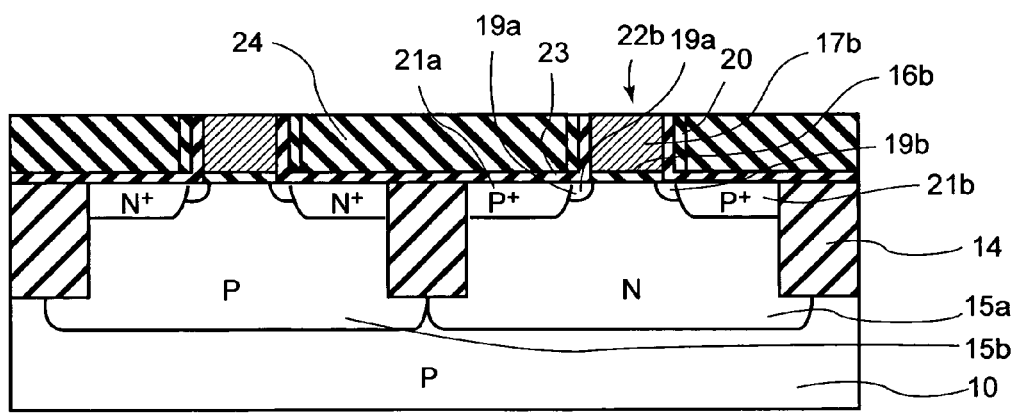

Further, a dry etching or CMP method is applied to make the surface of silicon substrate 10 even. As shown in FIG. 1M, damascene structure 22b consisting of a stack of gate electrode film 17b and gate insulation film 16b is formed, accordingly.

After that, a plasma CVD method is employed to deposit a silicon oxide film to form an interlayer insulation layer and heating treatment, a CMP method, and the like are applied to make the surface of the interlayer insulation layer flat. Contact holes are made in the interlayer insulation layer to form a gate electrode of the N-channel MISFET forming region, source and drain regions, and a gate electrode of the P-channel MISFET forming region. Metallic wiring made of Al, Cu or the like is provided for the source and drain regions.

Further, an interlayer insulation layer and metallic wiring may be alternatively and repeatedly made to form a multi-layer wiring structure. The entire surface of silicon substrate 10 is covered with a surface protection film but is provided with apertures made at pad portions. The method of manufacturing semiconductor devices of the first embodiment is completed in this way.

According to the first embodiment, short time heating treatment is carried out with a flash lamp to diffuse impurities implanted into a gate electrode film. Thus, it can provide a MISFET device with good element properties such as a high withstand voltage of the gate insulation layer.

In addition, according to the first embodiment, a threshold voltage of the gate electrode can be easily controlled by changing the work function of a silicide film used for the gate electrode of a MISFET device.

The work function of WSi$_2$ used for the gate electrode film of the first embodiment is in the range of 4.3 eV to 4.6 eV in the event that no impurity is doped into WSi$_2$. An N-channel MISFET device can reduce the work function by 0.15 eV to 0.2 eV if phosphorus is doped into it as an impurity. On the other hand, a P-channel MISFET device can increase the work function by 0.15 eV to 0.2 eV if boron is doped into it as an impurity. Applications of this method to P-channel and N-channel MISFET device gate electrodes can provide a CMOS circuit with high performance characteristics.

Further, the work function of a gate electrode film can be controlled by the quantity of impurities. Thus, the work function of a CMOS circuit can be controlled by doping, for example, a desired quantity of an impurity into a P-channel MISFET device only but no impurity is doped into an N-channel MISFET device.

The usage of a damascene gate structure allows the carrying out of subsequent heating treatment at a relatively low temperature and obtains a highly reliable gate insulation layer. Therefore, metallic oxide such as hafnium oxide can be used for a gate insulation layer.

SECOND EMBODIMENT

FIGS. 2A–2J show schematically cross-sectional views of processes in order in a method of manufacturing semiconductor devices in accordance with the second embodiment of the present invention. This embodiment is applied to manufacture MISFET devices with the structure of a damascene CMOS circuit.

First, manufacturing processes to form element isolation regions in a semiconductor substrate will be explained below with reference to FIGS. 2A–2C.

Figure 2A:
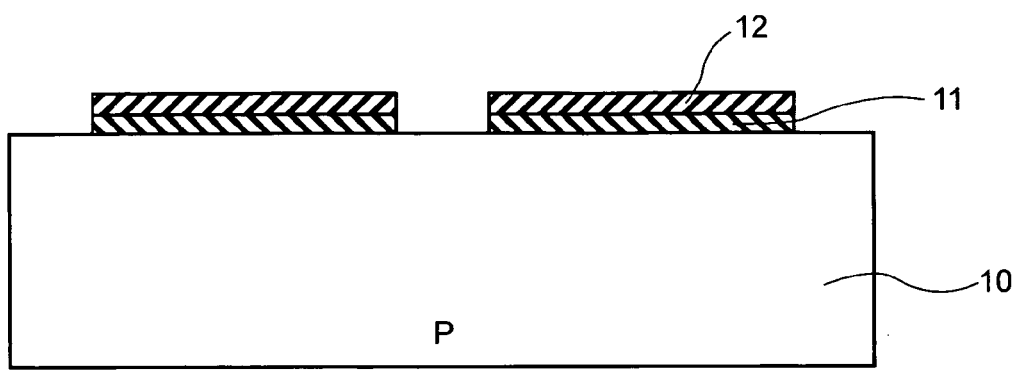
FIGS. 2A–2J are schematically cross-sectional views to explain a series of processes of a method of manufacturing semiconductor devices in accordance with the second embodiment of the present invention.
Figure 2B:
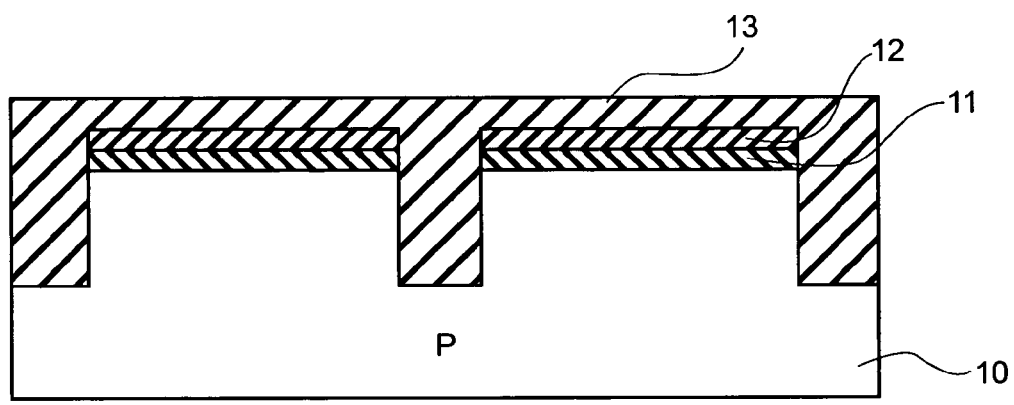

As shown in FIG. 2A, the first and second insulation films 11 and 12 are, in turn, formed on a P-type silicon semiconductor substrate 10. Insulation films 11 and 12 are made from silicon oxide and silicon nitride, for example, respectively. Subsequently, lithography and etching methods are applied to selectively etch the first and second insulation films 11 and 12 to make a mask pattern.

Next, a dry etching method is carried out to make shallow trenches in silicon substrate 10 by utilizing the first and second insulation films 11 and 12 as a mask. As shown in FIG. 2B, a silicon oxide film, for example, is formed as the third insulation film 13 by applying a CVD method, and it is filled in the trenches and covers the second insulation film 12 on silicon substrate 10.

Then, CMP and etching methods are applied to eliminate the third insulation film 13 and the first and second insulation films 11 and 12 used as the mask from silicon substrate 10 while making the surface of silicon substrate 10 even. As shown in FIG. 2C, element isolation regions 14 of shallow trenches filled with the third insulation film 13 are formed.

Figure 2C:
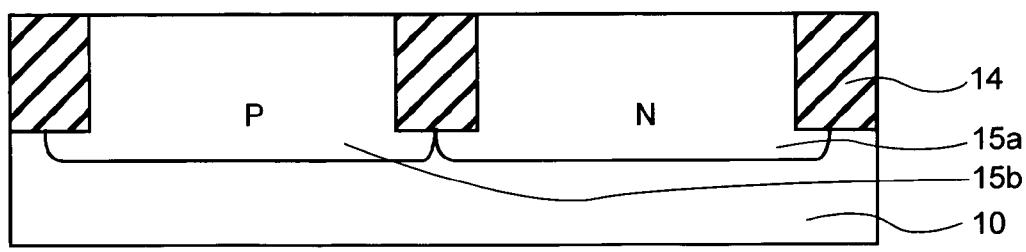

Next, as shown in FIG. 2C, an ion implantation method is carried out to implant phosphorus of an N-type impurity into a P-channel MISFET forming region so that N-type well region 15a is formed. On the other hand, boron of a P-type impurity is implanted into an N-channel MISFET forming region to form P-type well region 15b. Dosed amounts of phosphorus and boron each are approximately 1E12 $cm^{-2}$ to 1E13 $cm^{-2}$. After that, rapid heating treatment at a temperature of 900° C. for 10 sec., for example, is carried out to activate the implanted impurities. This results in forming P-channel and N-channel MISFET regions in a CMOS circuit structure.

Now, manufacturing processes to form a dummy gate structure will be explained below with reference to FIGS. 2D–2F.

First, an approximately 10 nm silicon oxide film (not shown) is formed on silicon substrate 10. Electrically conductive impurity is implanted into silicon substrate 10 through the silicon oxide film to control a threshold voltage of a MISFET device. That is, an ion implantation method is applied to selectively implant arsenic of an N-type impurity and boron of a P-type impurity into N-type and P-type wells 15a and 15b, respectively. Dosed amounts of arsenic and boron each are approximately 1E13 $cm^{-2}$ to 1E14 $cm^{-2}$. Rapid heating treatment at a temperature of 900° C. for 10 sec., for example, is then carried out to activate the implanted impurities.

Figure 2D:
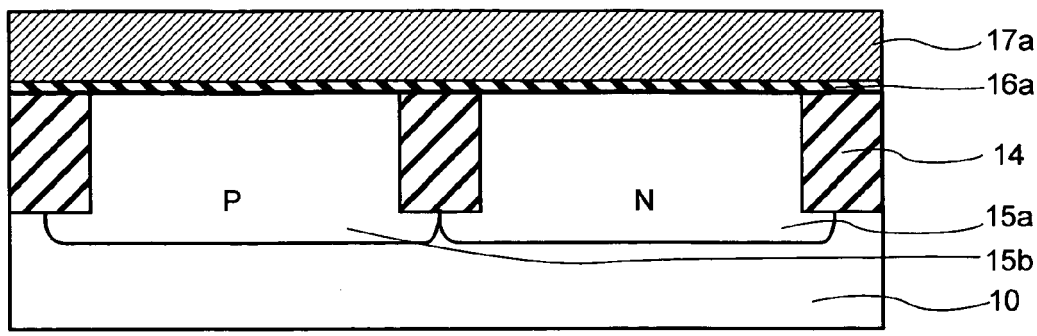

Subsequently, as shown in FIG. 2D, silicon substrate 10 is thermally oxidized in an oxygen atmosphere at temperatures of 800° C. to 900° C. to form a thermal oxidation film for dummy gate insulation film 16a with a thickness of about 6 nm. Further, a CVD method is applied to grow a poly-crystalline silicon film to be about 100 nm in thickness, for example, as dummy gate electrode film 17a on dummy gate insulation film 16a. Further, silicon nitride cap film 18, for example, is grown to be 30 nm as shown in FIG. 2E.

Figure 2E:
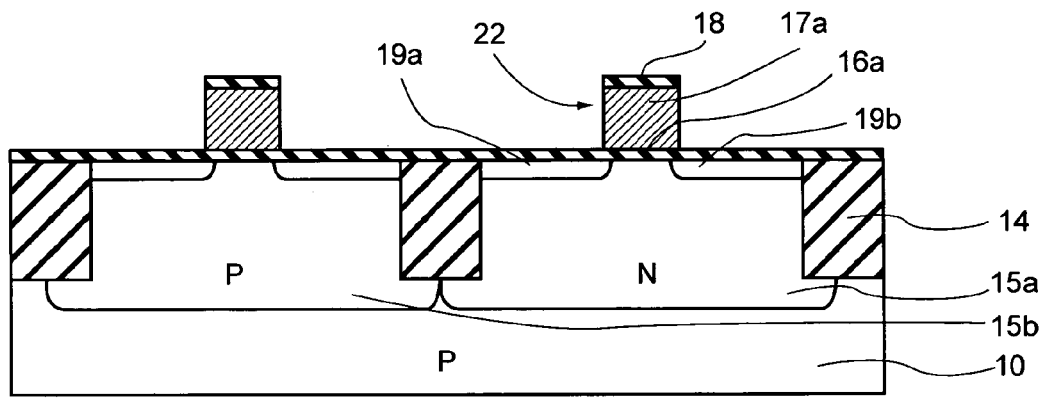

Next, as shown in FIG. 2E, a lithography method and a dry etching method are applied to selectively etch silicon nitride cap film 18 and dummy gate electrode film 17a so that dummy gate structure 22 is formed on silicon substrate 10. Further, an ion implantation method is employed to form extension regions 19a and 19b by using dummy gate electrode film 17a as a mask. In other words, ion implantations are carried out to selectively implant boron of a P-type impurity and arsenic of an N-type impurity into extension regions 19a and 19b, respectively. Dosed amounts of boron and arsenic each are approximately 1E13 $cm^{-2}$ to 1E15 $cm^{-2}$. After that, rapid heating treatment at a temperature of 900° C. for 10 sec., for example, is carried out to activate the implanted impurities. Alternatively, after etching dummy gate insulation film 16a through a mask of silicon nitride cap film 18 and dummy gate electrode film 17a, extension regions 19a and 19b may be formed.

Figure 2F:
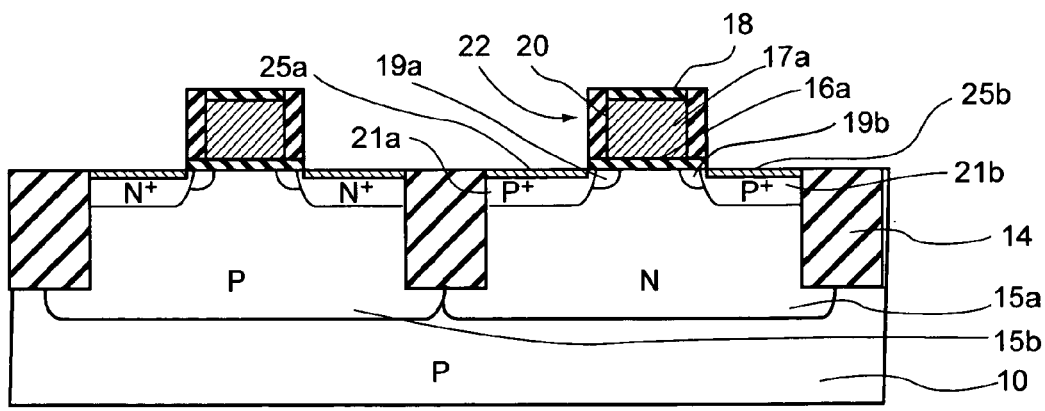

Next, as shown in FIG. 2F, a CVD method is applied to form a silicon nitride film covering the surface of silicon substrate 10. The silicon nitride film is 20 nm to 40 nm in thickness. A dry etching method is then carried out to eliminate the silicon nitride film from the upper surface of silicon substrate 10 and silicon nitride cap film 18 and to leave selectively the silicon nitride film as sidewall insulation film 20 around the circumference of dummy gate structure 22.

Subsequently, an ion implantation method is applied to implant ions through a mask consisting of dummy gate structure 22 and sidewall insulation film 20 so that source and drain regions 21a and 21b are formed. More particularly, boron of a P-type impurity and arsenic of an N-type impurity are selectively implanted into N-type well region 15a and P-type well region 15b, respectively. Dosed amounts of boron and arsenic each are approximately 1E15 $cm^{-2}$ to 1E16 $cm^{-2}$. After that, rapid heating treatment at a temperature of 900° C. for 10 sec., for example, is carried out to activate the implanted impurities. Further, dummy gate insulation film 16a is etched through a mask consisting of dummy gate structure 22 and sidewall insulation film 20.

Next, a sputter method is employed to form a cobalt film, not shown, covering silicon substrate 10. Subsequently, heating treatment is carried out for the silicon layer of source and drain regions to react with the cobalt film only to selectively form cobalt silicide layers 25a and 25b on source and drain regions 21a and 21b shown in FIG. 2F, respectively. The other residual cobalt layers are then selectively removed.

Figure 2G:
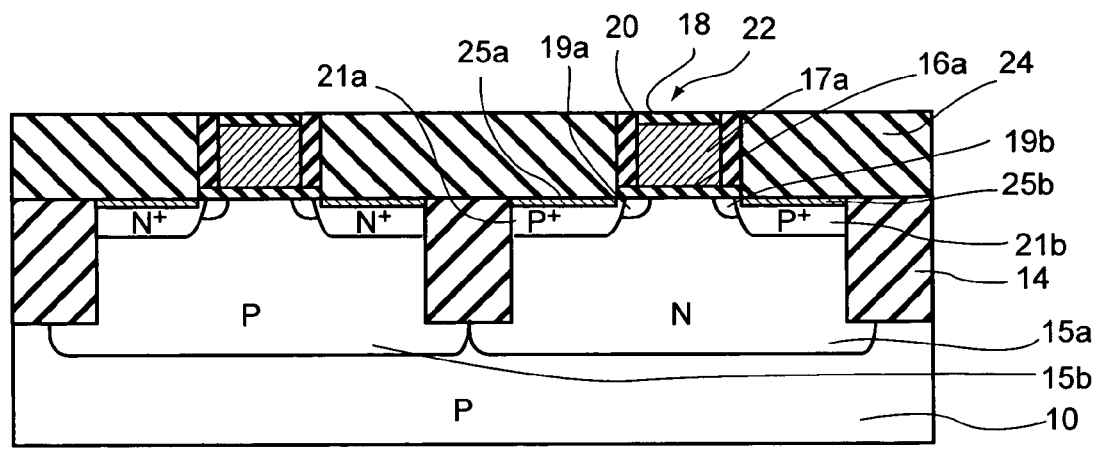

A CVD method is then applied to form a silicon oxide film covering silicon substrate 10. CMP and etching methods are then carried out to remove the silicon oxide film and expose the upper surfaces of cap film 18 and sidewall insulation film 20. As shown in FIG. 2G, the surface is made even and interlayer insulation film 24 is selectively left.

Figure 2H:
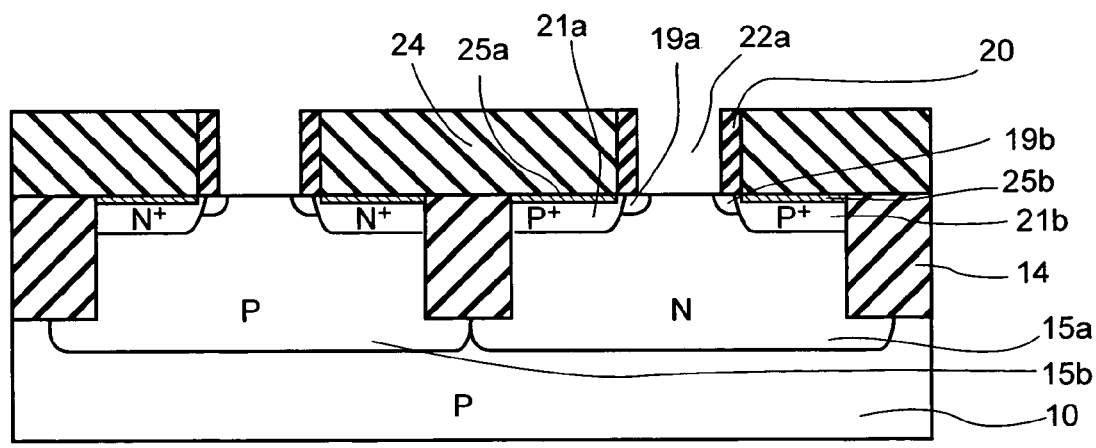

Further, as shown in FIG. 2H, phosphoric acid, for example, is used to selectively eliminate silicon nitride cap film 18 against silicon oxide interlayer insulation film 24. An etching method employing radicals of halogen atoms, such as those of fluorine atoms, is applied to selectively remove dummy electrode films 17a consisting of poly-crystalline silicon from silicon oxide interlayer insulation film 24 and silicon nitride sidewall insulation film 20. Further, diluted hydrofluoric acid, for example, is used to remove dummy gate insulation film 16a and to form space region 22a in which a gate insulation film and a gate electrode are provided as explained below.

Figure 2I:
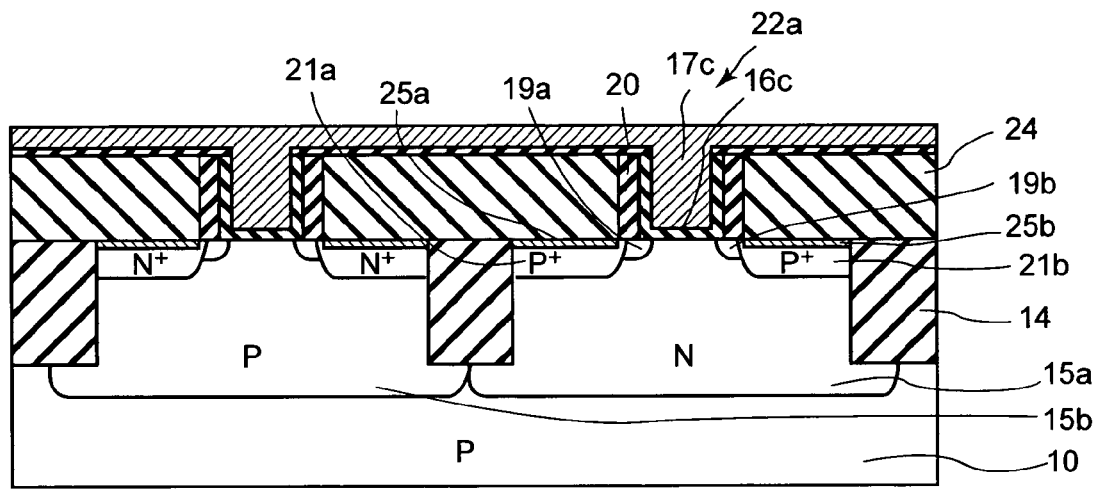

Next, as shown in FIG. 2I, a CVD or sputter method is employed to form high dielectric gate insulation film 16c of hafnium oxide covering silicon substrate 10. A CVD or sputter method is also used to form silicide gate electrode film 17c such as $NiSi_2$ with a thickness of 100 nm. Gate electrode film 17 is filled in space region 22a and is also formed on the surface of silicon substrate 10.

Further, impurities are implanted into gate electrode films 17c of P-channel and N-channel MISFET devices to control the work function of gate electrode films 17c. The impurity implantation process is substantially the same as in the first embodiment and its explanation is omitted, accordingly. Thus, gate electrode films 17c are impurity doped metal silicide ones in this case.

An ion implantation method is applied to selectively implant boron of a P-type impurity into gate electrode film 17c of N-type well region 15a in a P-channel MISFET device. Dosed amount of boron is approximately 1E15 cm$^{-2}$ to 1E16 cm$^{-2}$. Likewise, an ion implantation method is also used to selectively implant phosphorus of an N-type impurity into gate electrode film 17c of P-type well region 15b in N-channel MISFET devices. A dosed amount of phosphorus is approximately 1E15 cm$^{-2}$ to 1E16 cm$^{-2}$.

A flash lamp annealing method is carried out to diffuse the implanted boron, which is a P-type impurity with respect to silicon, and the implanted phosphorus, which is an N-type impurity with respect to silicon. Silicon substrate 10 is heated at a temperature of 550° C. and is irradiated with incoherent light beams consisting primarily of visible light-wavelengths for 10 msec. to 100 nsec. By using such a flash lamp, only gate electrode film 17b of NiSi$_2$ is effectively heated at a high temperature for such a short period of time.

Figure 2J:
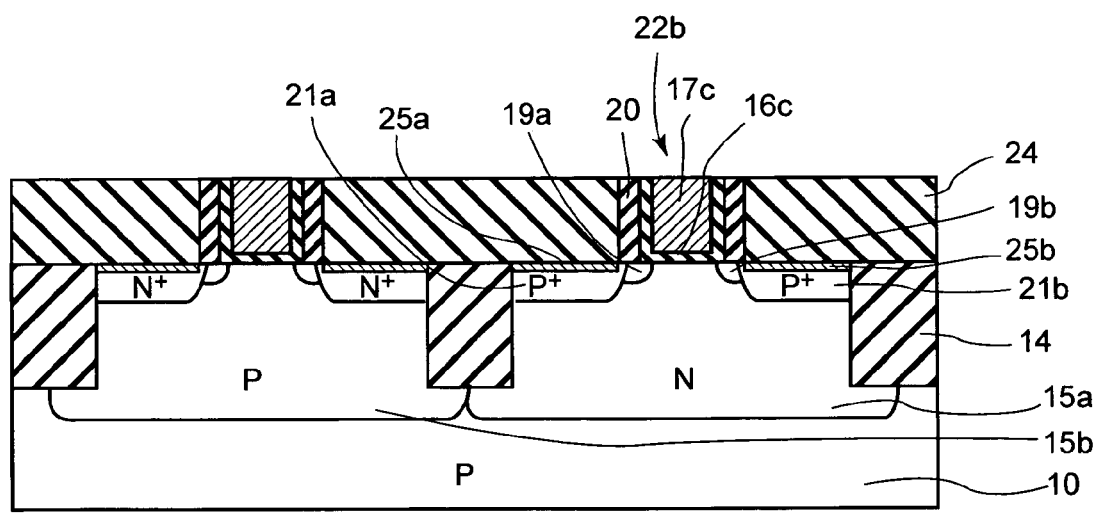

Further, a dry etching or CMP method is applied to make the surface of silicon substrate 10 even. As shown in FIG. 2J, damascene structure 22b covered with gate electrode film 17c and high dielectric gate insulation film 16c is formed.

After that, a plasma CVD method is employed to deposit a silicon oxide film, not shown, for an interlayer insulation film and, then, heating treatment, a CMP method, and the like are applied to make the surface of the interlayer insulation film flat. Contact holes are made in the interlayer insulation film to form a gate electrode of an N-channel MISFET device, source and drain regions, and a gate electrode of a P-channel MISFET device. Metallic wiring made of Al, Cu or the like is provided for the source and drain regions.

Further, an interlayer insulation film and metallic wiring may be alternatively and repeatedly made to form a multi-layer wiring structure. The entire surface of silicon substrate 10 is covered with a surface protection film but is provided with apertures made at pad portions. The method of manufacturing semiconductor devices of the second embodiment is completed in this way.

According to this second embodiment, short time heating treatment is carried out with a flash lamp to diffuse impurities implanted into a gate electrode film. Thus, it can provide a MISFET device with good element properties such as a high withstand voltage of the gate insulation film.

In addition, according to the second embodiment, a threshold voltage of the gate electrode can be easily controlled by changing the work function of a silicide film used for the gate electrode of a MISFET device.

The work function of the gate electrode film may be also controlled by a quantity of impurities. Thus, the work function of a CMOS circuit may be controlled by doping, for example, a desired quantity of an impurity into a P-channel MISFET device only but no impurity is doped into an N-channel MISFET device.

The usage of a damascene gate structure allows the carrying out of subsequent heating treatment at a relatively low temperature and obtains a highly reliable gate insulation film.

Since silicide layers are formed in source and drain regions, a MISFET device can operate much faster.

THIRD EMBODIMENT

FIGS. 3A–3I show schematically cross-sectional views of processes in order in a method of manufacturing semiconductor devices in accordance with the third embodiment of the present invention. This embodiment is applied to manufacture MISFET devices with the structure of an ordinary CMOS circuit.

Manufacturing processes to form element isolation regions in a semiconductor substrate will be explained below with reference to FIGS. 3A–3C.

Figure 3A:
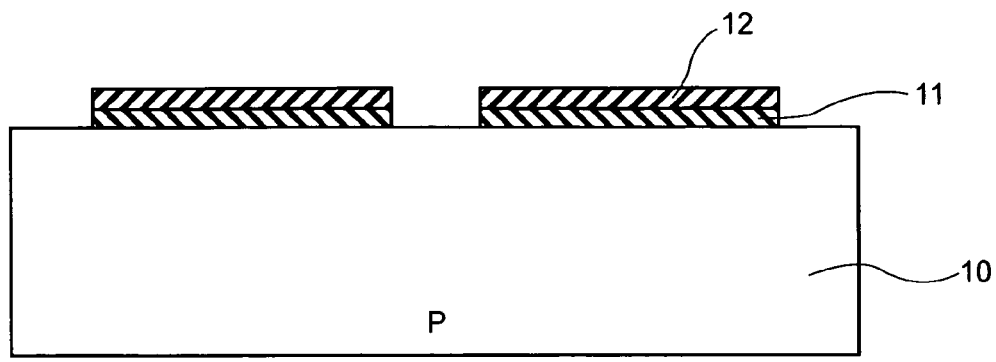
FIGS. 3A–3I are schematically cross-sectional views to explain a series of processes of a method of manufacturing semiconductor devices in accordance with the third embodiment of the present invention.
Figure 3B:
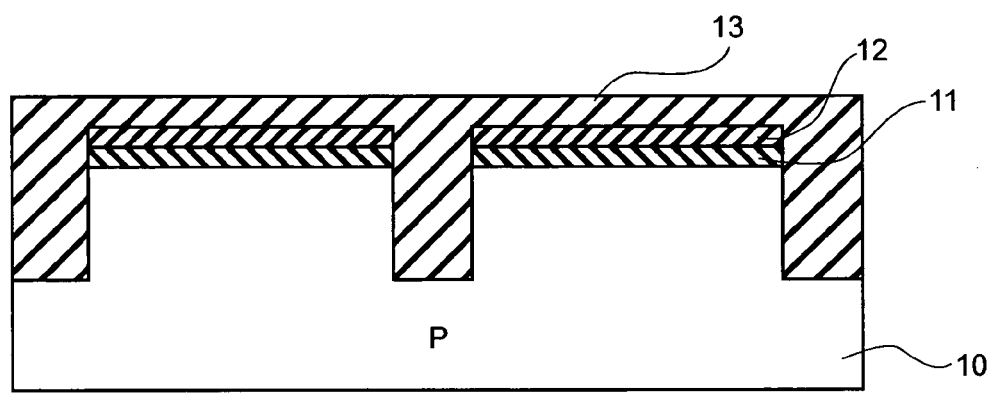

As shown in FIG. 3A, the first and second insulation films 11 and 12 are, in turn, formed on a P-type silicon semiconductor substrate 10. Insulation films 11 and 12 are made from silicon oxide and silicon nitride, for example, respectively. Subsequently, lithography and etching methods are applied to selectively etch the first and second insulation films 11 and 12 to make a mask pattern.

Next, a dry etching method is carried out to make shallow trenches in silicon substrate 10 by utilizing the first and second insulation films 11 and 12 as a mask. As shown in FIG. 3B, a silicon oxide film, for example, is formed as the third insulation film 13 by applying a CVD method, and it is filled in the trenches and covers the second insulation film 12 on silicon substrate 10.

Then, CMP and etching methods are applied to eliminate the third insulation film 13, and the first and second insulation films 11 and 12 used as the mask from silicon substrate 10 while making the surface of silicon substrate 10 even. As shown in FIG. 3C, element isolation regions 14 of shallow trenches filled with the third insulation film 13 are formed.

Figure 3C:
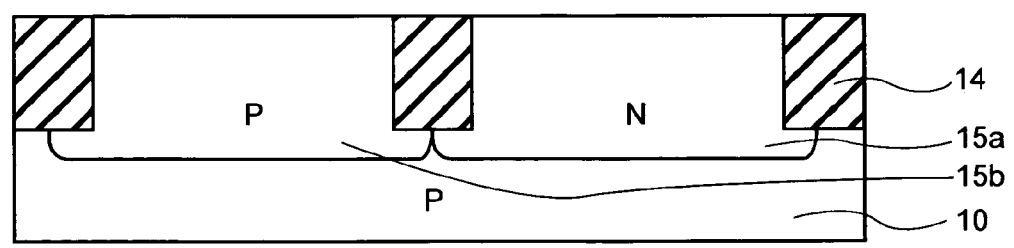

Next, as shown in FIG. 3C, an ion implantation method is carried out to implant phosphorus of an N-type impurity into a P-channel MISFET region so that N-type well region 15a is formed. On the other hand, boron of a P-type impurity is implanted into an N-channel MISFET region to form P-type well region 15b. Dosed amounts of phosphorus and boron each are approximately 1E12 cm$^{-2}$ to 1E13 cm$^{-2}$. After that, rapid heating treatment at a temperature of 900° C. for 10 sec., for example, is carried out to activate the implanted impurities. This results in forming P-channel and N-channel MISFET regions in a CMOS circuit structure.

Now, manufacturing processes to form a gate structure will be explained below with reference to FIGS. 3D–3I.

First, an approximately 10 nm silicon oxide film (not shown) is formed on silicon substrate 10. In order to control a threshold voltage of a MISFET device, an ion implantation method is applied to selectively implant arsenic of an N-type impurity and boron of a P-type impurity into N-type and P-type wells 15a and 15b, respectively, through the silicon oxide film. Dosed amounts of arsenic and boron each are approximately 1E13 cm$^{-2}$ to 1E14 cm$^{-2}$. Rapid heating treatment at a temperature of 900° C. for 10 sec., for example, is then carried out to activate the implanted impurities.

Figure 3D:
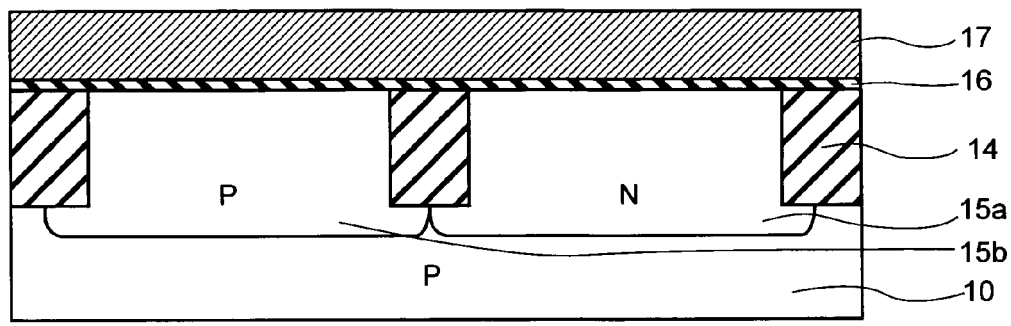

Subsequently, as shown in FIG. 3D, silicon substrate 10 is thermally oxidized in an oxygen atmosphere at a temperature of 900° C. to form a thermal oxidation film used for gate insulation film 16 with a thickness of about 6 nm. Further, a CVD method is applied to grow a WSix film to be about 100 nm in thickness, for example, as gate electrode film 17a on gate insulation film 16a.

Figure 3E:
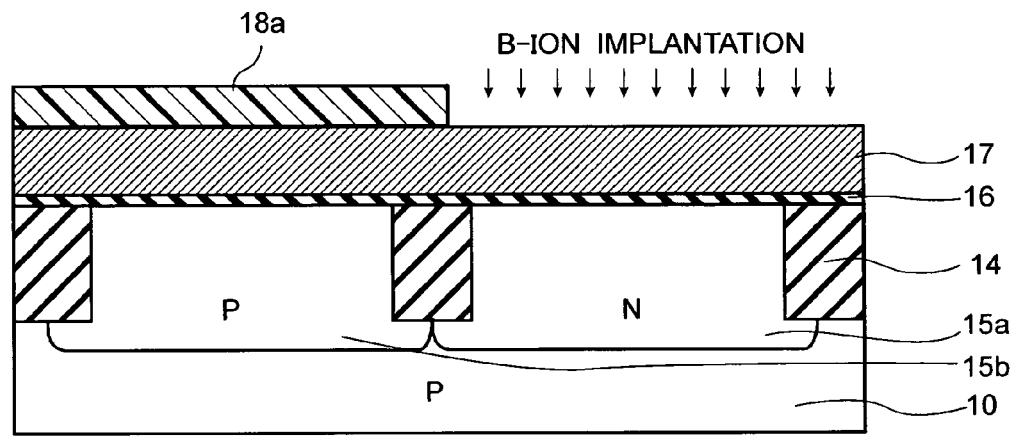

Next, as shown in FIG. 3E, a lithography method is applied to selectively cover gate electrode film 17 with first photoresist film 18a. Further, an ion implantation method is carried out to selectively implant boron of a P-type impurity into gate electrode film 17 of an N-type well region in a P-channel MISFET device. A dosed amount of boron is approximately 1E15 cm$^{-2}$ to 1E16 cm$^{-2}$. After that, the first photoresist film 18a is removed.

Figure 3F:
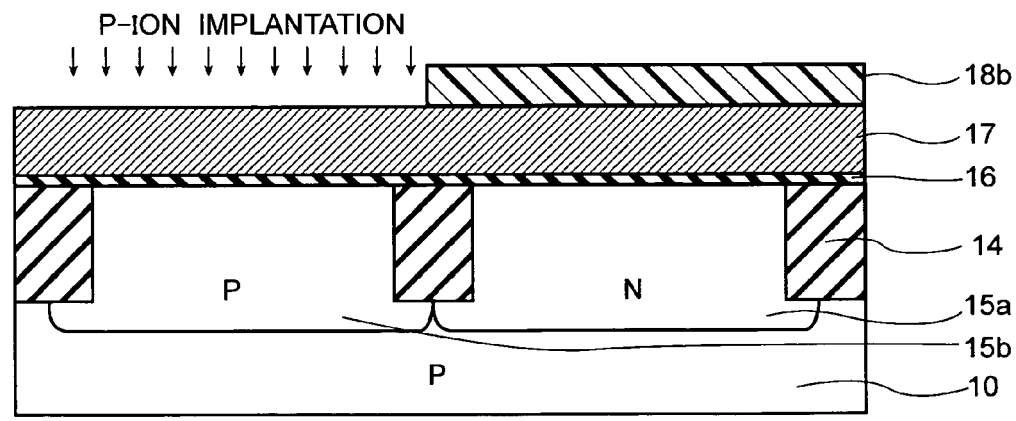

Further, as shown in FIG. 3F, a lithography method is used to cover gate electrode film 17 on N-type well region 15a formed in the P-channel MISFET device with the second photoresist film 18b. After that, an ion implantation method is used to implant phosphorus of an N-type impurity into gate electrode film 17 on P-type well region 15b formed in the N-channel MISFET device. A dosed amount of phosphorus is about 1E15 cm$^{-2}$ to 1E16 cm$^{-2}$. The second photoresist film 18b is then removed. Thus, gate electrode film 17 is made from impurity doped metal silicide.

Figure 3G:
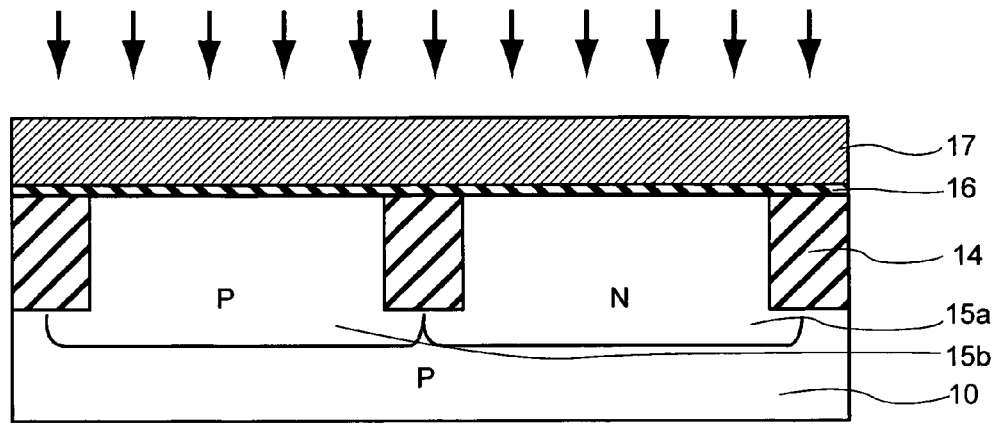

As shown in FIG. 3G, a flash lamp annealing method is carried out to diffuse the implanted boron and phosphorus. Silicon substrate 10 is heated at a temperature of 550° C. and is irradiated with incoherent light beams consisting primarily of visible light-wavelengths for 10 msec. to 100 nsec. By using such a flash lamp annealing method, only gate electrode film 17 of WSi$_2$ is effectively heated at a high temperature.

Figure 3H:
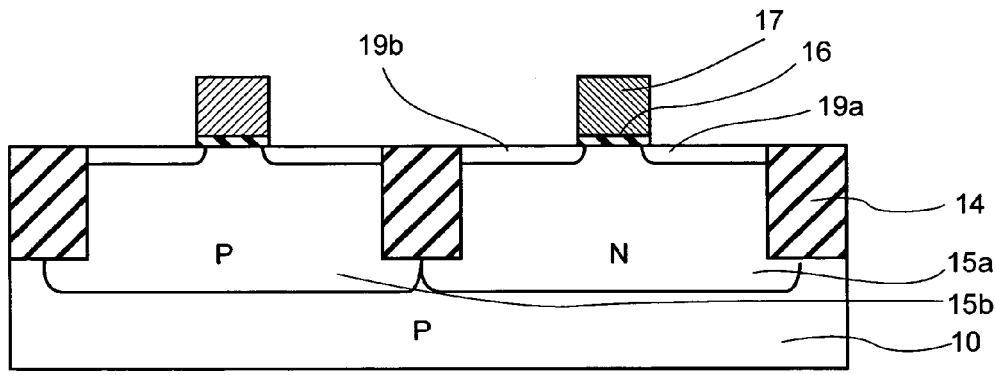

Subsequently, lithography and dry etching methods are applied to selectively etch gate electrode film 17 and gate insulation film 16 so that a layer stack structure is made of gate electrode film 17 and gate insulation film 16 as shown in FIG. 3H. Further, an ion implantation method is carried out to form extension regions 19a and 19b by using gate electrode film 17 as a mask. That is, boron of a P-type impurity and arsenic of an N-type impurity are selectively implanted into N-type and P-type wells, respectively. Dosed amounts of boron and arsenic each are about 1E13 cm$^{-2}$ to 1E15 cm$^{-2}$. Thereafter, rapid heating at a temperature of 900° C. for 10 sec. is carried out to activate the implanted impurities. Alternatively, without patterning the thermal oxidation film, an ion implantation method may be applied to form extension regions 19a and 19b and, then, patterning of the thermal oxidation film may be also performed to form a gate insulation film region.

Figure 3I:
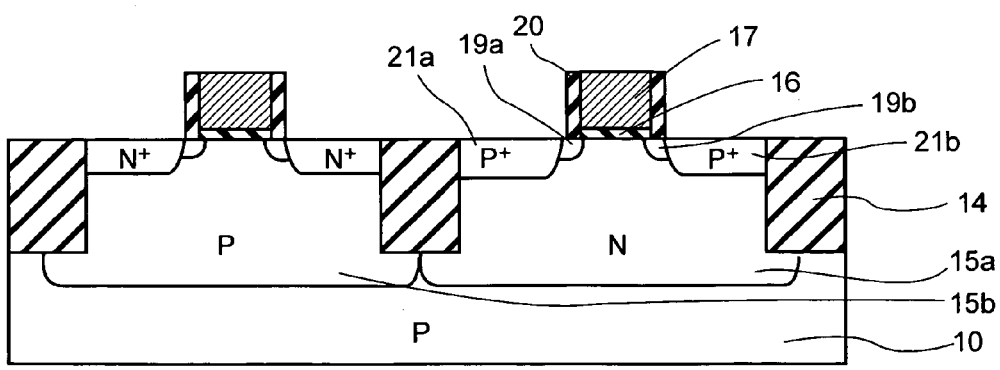

Next, a CVD method is applied to form a silicon nitride film covering the surface of silicon substrate 10. The silicon nitride film is 20 nm to 40 nm in thickness. A dry etching method is then carried out to eliminate the upper surface of silicon substrate 10 and gate electrode film 17 and to leave selectively the silicon nitride film as sidewall insulation film 20 around the circumference of gate electrode film 17 as shown in FIG. 3I. Subsequently, an ion implantation method is applied to implant ions through a mask consisting of gate electrode film 17 and sidewall insulation film 20 so that source and drain regions 21a and 21b are formed. More particularly, boron of a P-type impurity and arsenic of an N-type impurity are selectively implanted into N-type and P-type well regions 15a and 15b, respectively. Dosed amounts of boron and arsenic each are approximately 1E15 cm$^{-2}$ to 1E16 cm$^{-2}$. After that, rapid heating treatment at a temperature of 900° C. for 10 sec., for example, is carried out to activate the implanted impurities.

After that, a CVD method is employed to deposit a silicon oxide film, not shown, for an interlayer insulation film and, then, heating treatment, a CMP method, and the like are applied to make the surface of the interlayer insulation film flat. Contact holes are made in the interlayer insulation film to form a gate electrode of an N-channel MISFET device, source and drain regions, and a gate electrode of a P-channel MISFET device. Metallic wiring made of Al, Cu or the like is provided for the source and drain regions.

Further, an interlayer insulation film and metallic wiring may be alternatively and repeatedly made to form a multilayer wiring structure. The entire surface of silicon substrate 10 is covered with a surface protection film but is provided with apertures made at pad portions. The method of manufacturing semiconductor devices of the third embodiment is completed in this way.

According to this third embodiment, short time heating treatment is carried out with a flash lamp to diffuse impurities implanted into a gate electrode film. Thus, it can provide a MISFET device with good element properties such as a high withstand voltage of the gate insulation film.

In addition, according to the third embodiment, a threshold voltage of the gate electrode can be easily controlled by changing the work function of a silicide film used for the gate electrode of a MISFET device.

The work function of WSi$_2$ used for the gate electrode film of this embodiment is in the range of 4.3 eV to 4.6 eV in the event that no impurity is doped into WSi$_2$. An N-channel MISFET device can reduce the work function by 0.15 eV to 0.2 eV if phosphorus is doped into it as an impurity. On the other hand, a P-channel MISFET device can increase the work function by 0.15 eV to 0.2 eV if boron is doped into it as an impurity. Applications of this method to P-channel and N-channel MISFET device gate electrodes can provide a CMOS circuit with high performance characteristics.

The work function of the gate electrode film can be also controlled by a quantity of impurities. Thus, the work function of a CMOS circuit may be controlled by doping, for example, a desired quantity of an impurity into a P-channel MISFET device only but no impurity may be doped into an N-channel MISFET device.

FOURTH EMBODIMENT

FIGS. 4A–4F show schematically cross-sectional views of processes by order in a method of manufacturing semiconductor devices in accordance with the fourth embodiment of the present invention. This embodiment is applied to manufacture MISFET devices with the structure of ordinary CMOS circuits.

In the manufacturing method of this embodiment, impurities are doped into silicide films when the silicide films are formed. Except that process, the manufacturing method is basically the same as that of the third embodiment.

First, manufacturing processes to form element isolation regions in a semiconductor substrate will be explained below with reference to FIGS. 4A–4C.

Figure 4A:
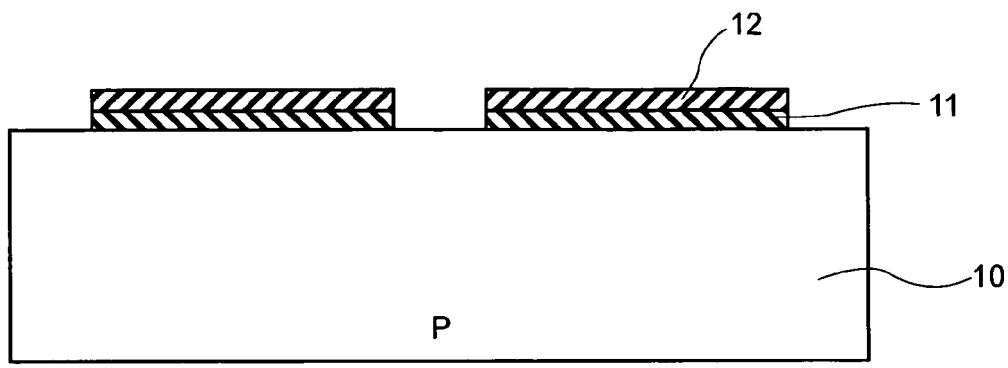
FIGS. 4A–4F show schematically cross-sectional views of processes in order in a method of manufacturing semiconductor devices in accordance with the first embodiment of the present invention. By way of example, this embodiment is applied to manufacture MISFET devices with the structure of a damascene type CMOS circuit.
Figure 4B:
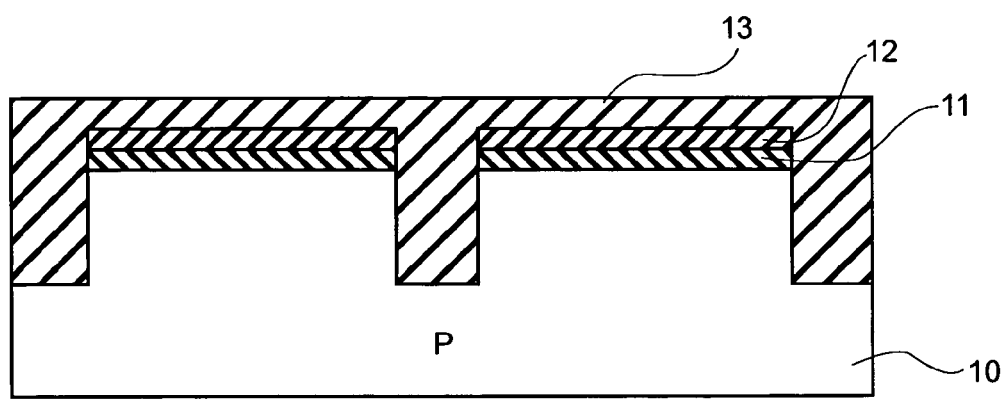

As shown in FIG. 4A, the first and second insulation films 11 and 12 are, in turn, formed on P-type silicon semiconductor substrate 10. Insulation films 11 and 12 are made from silicon oxide and silicon nitride, for example, respectively. Subsequently, lithography and etching methods are applied to selectively etch the first and second insulation films 11 and 12 to make a mask pattern.

Next, a dry etching method is carried out to make shallow trenches in silicon substrate 10 by utilizing the first and second insulation films 11 and 12 as a mask. As shown in FIG. 4B, a silicon oxide film, for example, is formed as the third insulation film 13 by applying a CVD method, and it is filled in the trenches and covers the second insulation film 12 on silicon substrate 10.

Then, CMP and etching methods are applied to eliminate the third insulation film 13, and the first and second insulation films 11 and 12 used as the mask from silicon substrate 10 while making the surface of silicon substrate 10 even. As shown in FIG. 4C, element isolation regions 14 of shallow trenches filled with the third insulation film 13 are formed.

Figure 4C:
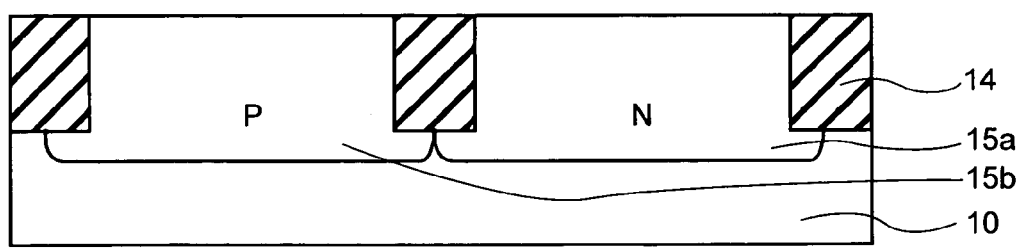

Next, as shown in FIG. 4C, an ion implantation method is carried out to implant phosphorus of an N-type impurity into a P-channel MISFET region so that N-type well region 15*a* is formed. On the other hand, boron of a P-type impurity is implanted into an N-channel MISFET region to form P-type well region 15*b*. Dosed amounts of phosphorus and boron each are approximately 1E12 cm$^{-2}$ to 1E13 cm$^{-2}$. After that, rapid heating treatment at a temperature of 900° C. for 10 sec., for example, is carried out to activate the implanted impurities. This results in forming P-channel and N-channel MISFET regions in a CMOS circuit structure.

Now, manufacturing processes to form a gate structure will be explained below with reference to FIGS. 4D–4F.

First, an approximately 10 nm silicon oxide film (not shown) is formed on silicon substrate 10. In order to control a threshold voltage of a MISFET device, an ion implantation method is applied to selectively implant arsenic of an N-type impurity and boron of a P-type impurity into N-type and P-type wells 15*a* and 15*b*, respectively, through the silicon oxide film. Dosed amounts of arsenic and boron each are approximately 1E13 cm$^{-2}$ to 1E14 cm$^{-2}$. Rapid heating treatment at a temperature of 900° C. for 10 sec., for example, is then carried out to activate the implanted impurities.

Figure 4D:
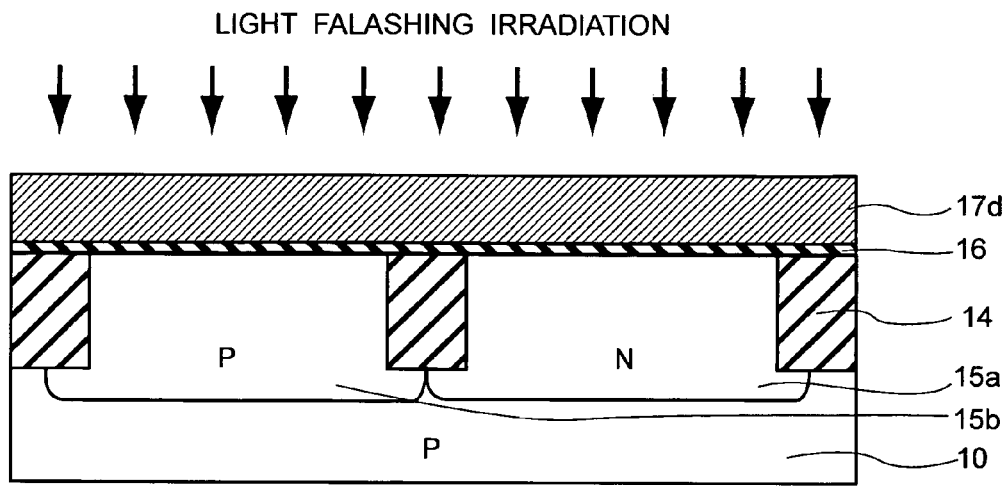

Subsequently, as shown in FIG. 4D, silicon substrate 10 is thermally oxidized in an oxygen atmosphere at a temperature of 900° C. to form a thermal oxidation film used for gate insulation film 16 with a thickness of about 6 nm. Further, a CVD method is applied to a WSi$_2$ silicide film with a thickness of about 100 nm, for example, as gate electrode film 17*d*. Further, when gate electrode film 17*d* is formed, a PH$_3$ gas is introduced into a CVD chamber to dope decomposed phosphorus into the silicide film. Thus, gate electrode film 17*d* is made from impurity doped silicide.

Next, a flash lamp annealing method is carried out to diffuse the implanted phosphorus of an N-type impurity. Silicon substrate 10 is heated at a temperature of 550° C. and is irradiated with incoherent light beams consisting primarily of visible light-wavelengths for 10 msec. to 100 msec. By using such a flash lamp annealing method, only gate electrode film 17*d* of WSi$_2$ is effectively heated at a high temperature for such a short period of time.

Figure 4E:
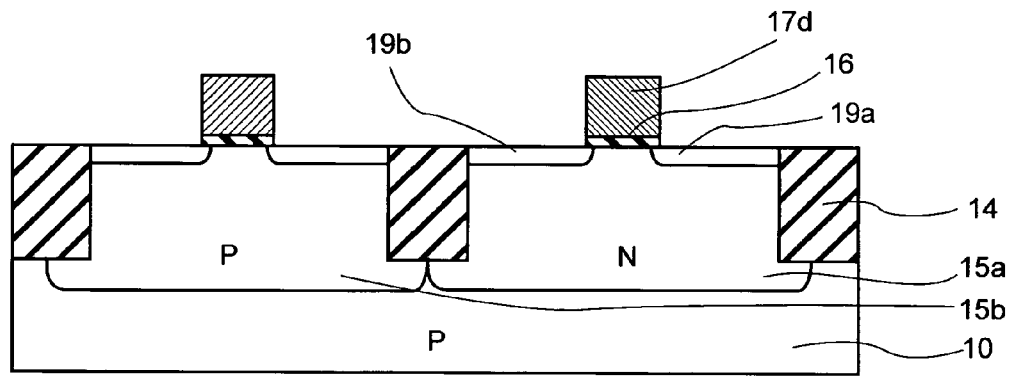
Figure 4F:
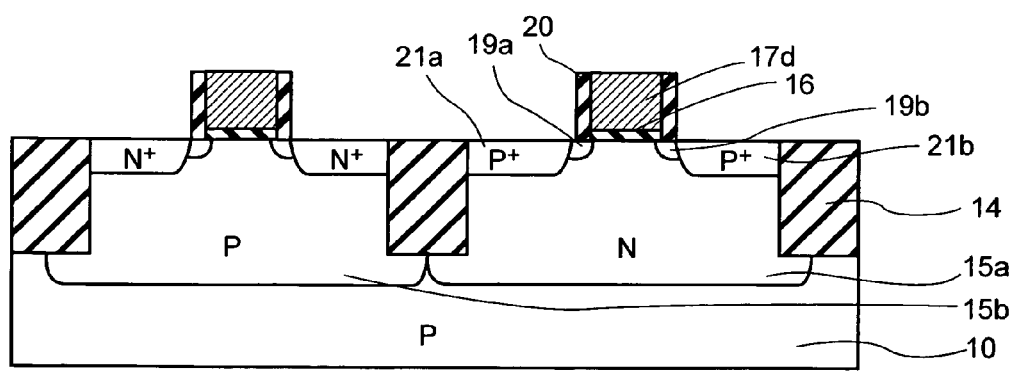

Subsequently, lithography and dry etching methods are applied to selectively etch gate electrode film 17*d* and gate insulation film 16 so that a layer stack structure consisting of gate insulation film 16 and gate electrode film 17*d* is formed as shown in FIG. 4E.

Further, an ion implantation method is carried out to form extension regions 19*a* and 19*b* by using gate electrode film 17*d* as a mask. That is, boron of a P-type impurity and arsenic of an N-type impurity are selectively implanted into N-type and P-type wells 15*a* and 15*b*, respectively. Dosed amounts of boron and arsenic each are about 1E13 cm$^{-2}$ to 1E15 cm$^{-2}$. Thereafter, rapid heating at a temperature of 900° C. for 10 sec., for example, is carried out to activate the implanted impurities.

Next, a CVD method is applied to deposit a silicon nitride film covering the surface of silicon substrate 10. The silicon nitride film is 20 nm to 40 nm in thickness. A dry etching method is then carried out to eliminate only the upper surface of silicon substrate 10 and gate electrode film 17 and to leave selectively the silicon nitride film as sidewall insulation film 20 around the circumference of gate electrode film 17 as shown in FIG. 4F. Subsequently, an ion implantation method is applied to implant ions through a mask consisting of gate electrode film 17 and sidewall insulation film 20 so that source and drain regions 21*a* and 21*b* are formed. More particularly, boron of a P-type impurity and arsenic of an N-type impurity are selectively implanted into N-type and P-type well regions 15*a* and 15*b*, respectively. Dosed amounts of boron and arsenic each are approximately 1E15 cm$^{-2}$ to 1E16 cm$^{-2}$. After that, rapid heating treatment at a temperature of 900° C. for 10 sec., for example, is carried out to activate the implanted impurities.

After that, a CVD method is employed to deposit a silicon oxide film, not shown, for an interlayer insulation film and, then, heating treatment, a CMP method, and the like are applied to make the surface of the interlayer insulation film flat. Contact holes are made in the interlayer insulation film to form a gate electrode of an N-channel MISFET device, source and drain regions, and a gate electrode of a P-channel MISFET device. Metallic wiring made of Al, Cu or the like is provided for the source and drain regions.

Further, an interlayer insulation film and metallic wiring may be alternatively and repeatedly made to form a multilayer wiring structure. The entire surface of silicon substrate 10 is covered with a surface protection film but is provided with apertures made at pad portions. The method of manufacturing semiconductor devices of the fourth embodiment is completed in this way.

According to this fourth embodiment, short time heating treatment is carried out with a flash lamp to diffuse impurities implanted into a gate electrode film. Thus, it can provide a MISFET device with good element properties such as a high withstand voltage of the gate insulation film.

In addition, according to the fourth embodiment, since impurities are doped when a gate electrode film is formed, total manufacturing processes can be simplified. Further, the work function of a silicide film used for the gate electrode of a MISFET device can be changed by controlling an amount of impurities doped into the silicide film. Thus, a threshold voltage of the MISFET device can be easily controlled.

As many apparently different embodiments of the present invention may be widely made without departing from its spirit and scope, it is to be understood that the invention is not limited to the specific embodiments set forth above.

The impurity doped silicide electrode film is made from not only WSi$_2$ or Ni Si$_2$ but also another silicide of cobalt, titanium, tantalum, palladium, platinum, niobium, or the like.

Further, the composition ratio between metal and silicon in the impurity doped silicide electrode film is not always WSi$_2$ in the case of a tungsten silicide film. Properties of the other metal silicide electrode films and impurity doped metal silicide films are also controlled by changing their composition ratio.

In addition to phosphorus and boron, arsenic or antimony, and gallium or indium can be used for providing silicon with N-type and P-type electric conductivities, respectively, and are used as an impurity to be implanted into metal silicide electrode films and as that to be doped into impurity doped metal silicide films.

In order to dope an impurity into a metal silicide film, after an impurity doped silicon oxide film is formed on a metal silicide electrode film, heating treatment may be carried out.

An energy beam to be irradiated to an impurity doped metal silicide electrode film may be not only incoherent light from a flash lamp, a tungsten lamp, an ark lamp or the like but also a laser beam of excimer laser, argon laser or the like, or an electron beam.

A gate insulation film may be a silicon nitride film, or a film stack of silicon oxide and silicon nitride films besides a silicon oxide film. In addition, a metallic oxide film such as a titan oxide film, a hafnium oxide film, or the like can be used itself or in combination as a stack structure.

Besides a metal silicide film made from cobalt used for source and drain regions, another metal or metal silicide film may be made from tungsten, nickel, titanium, molybdenum, tantalum, palladium, platinum, niobium, or the like, by itself or in combination.

A semiconductor device provided with a metal silicide electrode film or impurity doped metal silicide electrode film is not limited to a MISFET device consisting of CMOS circuits, but may also be a single P-type or N-type MISFET device or a memory cell transistor device.

Besides a silicon substrate, a III–V group semiconductor substrate such as a GaAs substrate or an insulation substrate such as an SOI substrate may be used to perform substantially the same function as the silicon substrate.

What is claimed is:

1. A method of manufacturing semiconductor devices, comprising:
    forming element isolation regions in a semiconductor substrate;
    forming a gate insulation film in an element region surrounded by said element isolation regions;
    forming an impurity doped metal silicide film on said gate insulation film;
    irradiating primarily visible light beams to heat said silicide film so that a doped impurity of said silicide film is diffused to control a work function of said silicide film;
    forming a gate electrode film by patterning said silicide film;
    forming source and drain regions by doping an impurity into said element region by using at least said gate electrode film as a mask;
    forming extension regions by doping an impurity into a region surrounding said element region by using said gate electrode film as a mask, wherein said forming of said extension regions is carried out between said forming of said gate electrode film and said forming of said source and drain regions; and forming a sidewall insulation film on a sidewall of said gate insulation film.

2. A method of manufacturing semiconductor devices, comprising:
    forming element isolation regions in a semiconductor substrate;
    forming a dummy gate insulation film in an element region surrounded by said element isolation regions;
    forming a dummy gate electrode film on said dummy gate insulation film;
    patterning said dummy gate electrode film to form a dummy gate electrode;
    doping an impurity to form extension regions surrounding said element region by using said dummy gate electrode as a mask;
    forming a sidewall insulation film on a side surface of said dummy gate electrode forming source and drain regions by doping an impurity into said element region by using said dummy gate electrode provided with said sidewall insulation as a mask;
    covering said source and drain regions and said dummy gate with an interlayer insulation film;
    making said interlayer insulation film substantially even to expose said dummy gate electrode;
    eliminating said dummy gate electrode and said dummy gate insulation film to define a space;
    forming a gate insulation film in said space on said semiconductor substrate;
    forming an impurity doped metal silicide film on said gate insulation film; and
    irradiating energy beams to heat said silicide film.

3. A method of manufacturing semiconductor devices according to claim 2 wherein said impurity doped silicide film contains an impurity to provide said impurity doped silicide film with an electrically conductive type.

4. A method of manufacturing semiconductor devices according to claim 2, further comprising:
    forming a metal or silicide layer on said source and drain regions after said forming of said source and drain is carried out.

5. A method of manufacturing semiconductor devices, comprising:
    forming element isolation regions in a semiconductor substrate;
    forming first conductive type and second conductive type wells for making first conductive type and second conductive type metal insulator field effect transistor regions surrounded by said element isolation regions, respectively;
    forming gate insulation films on said first conductive type and second conductive type metal insulator gate field effect transistor regions;
    forming silicide films on said gate insulation films;
    doping a first conductive type impurity into said silicide film on said first conductive type metal insulator gate field effect transistor region;
    irradiating primarily visible light beams to heat said silicide film so that said first conductive type impurity is diffused to control a work function of said silicide film;
    patterning said silicide films to form gate electrode films;
    doping first conductive type and second conductive type impurities into said first conductive type and second conductive type metal insulator gate field effect transistor regions to form source and drain regions by using at least said gate electrode films as a mask, respectively;
    forming extension regions by doping an impurity into a region surrounding said element region by using said gate electrode film as a mask, wherein said forming of said extension regions is carried out between said forming of said gate electrode film and said forming of said source and drain regions; and
    forming a sidewall insulation film on a sidewall of said gate insulation film.

6. A method of manufacturing semiconductor devices comprising:
    forming element isolation regions in a semiconductor substrate;
    forming first conductive type and second conductive type well regions surrounded by said element isolation regions to make second conductive type and first conductive type metal insulator gate field effect transistor regions, respectively;
    forming dummy gate insulation films in said first conductive type and second conductive type metal insulator gate field effect transistor regions;

forming dummy gate electrode films on said dummy gate insulation films;

patterning said dummy gate electrode films to make dummy gate electrodes;

doping first conductive type and second conductive type impurities into said first conductive type and second conductive type metal insulator field effect transistors, respectively, to form extension regions by using said dummy gate electrode as a mask;

forming a sidewall insulation film on a sidewall of said dummy gate electrode;

doping first conductive type and second conductive type impurities into said first conductive type and second conductive type metal insulator field effect transistors, respectively, to form source and drain regions by using said dummy gate electrode provided with said sidewall insulation film as a mask;

covering said source and drain regions and said dummy gate with an interlayer insulation film;

making said interlayer insulation film substantially even to expose said dummy gate electrode;

eliminating said dummy gate electrode and said dummy gate insulation films to define a space;

forming a gate insulation film in said space on said semiconductor substrate;

forming a silicide film on said gate insulation film;

doping a first conductive type impurity into said silicide in said first conductive type metal insulator field effect transistor region; and irradiating energy beams to heat said silicide into which said first conductive type impurity is doped.

7. A method of manufacturing semiconductor devices according to claim 6, further comprising:

forming a metal or silicide layer on said source and drain regions after said forming of said source and drain is carried out.

8. A method of manufacturing semiconductor devices according to claim 6, wherein said energy beams are incoherent light.

9. A method of manufacturing semiconductor devices according to claim 8, wherein said incoherent light is in a substantially visible region.

10. A method of manufacturing semiconductor devices, comprising:

forming element isolation regions in a semiconductor substrate;

forming first conductive type and second conductive type wells for making first conductive type and second conductive type metal insulator field effect transistor regions surrounded by said element isolation regions, respectively;

forming gate insulation films on said first conductive type and second conductive type metal insulator gate field effect transistor regions;

forming silicide films on said gate insulation films;

doping a first conductive type impurity into said silicide film on said first conductive type metal insulator gate field effect transistor region;

irradiating primarily visible light beams to heat said silicide film so that said first conductive type impurity is diffused to control a work function of said silicide film;

patterning said silicide films to form gate electrode films;

doping first conductive type and second conductive type impurities into said first conductive type and second conductive type metal insulator gate field effect transistor regions to form source and drain regions by using at least said gate electrode films as a mask, respectively; and doping a second conductive type impurity into said silicide film of said second conductive type metal insulator gate field effect transistor region between said doping of said first conductive type impurity into said silicide film of said first conductive type metal insulator gate field effect transistor region and said irradiating of said visible light beams to heat said silicide film into which said second conductive type impurity is doped.

11. A method of manufacturing semiconductor devices, comprising:

forming element isolation regions in a semiconductor substrate;

forming first conductive type and second conductive type wells for making first conductive type and second conductive type metal insulator field effect transistor regions surrounded by said element isolation regions, respectively;

forming gate insulation films on said first conductive type and second conductive type metal insulator gate field effect transistor regions;

forming silicide films on said gate insulation films;

doping a first conductive type impurity into said silicide film on said first conductive type metal insulator gate field effect transistor region;

irradiating primarily visible light beams to heat said silicide film so that said first conductive type impurity is diffused to control a work function of said silicide film;

patterning said silicide films to form gate electrode films;

doping first conductive type and second conductive type impurities into said first conductive type and second conductive type metal insulator gate field effect transistor regions to form source and drain regions by using at least said gate electrode films as a mask, respectively; and forming a metal or silicide layer on said source and drain regions after said forming of said source and drain is carried out.

12. A method of manufacturing semiconductor devices, comprising:

forming element isolation regions in a semiconductor substrate;

forming a dummy gate insulation film in an element region surrounded by said element isolation regions;

forming a dummy gate electrode film on said dummy gate insulation film;

patterning said dummy gate electrode film to form a dummy gate electrode;

doping an impurity to form extension regions surrounding said element region by using said dummy gate electrode as a mask;

forming a sidewall insulation film on a side surface of said dummy gate electrode forming source and drain regions by doping an impurity into said element region by using said dummy gate electrode provided with said sidewall insulation as a mask;

covering said source and drain regions and said dummy gate with an interlayer insulation film;

making said interlayer insulation film substantially even to expose said dummy gate electrode;

eliminating said dummy gate electrode and said dummy gate insulation film to define a space;

forming a gate insulation film in said space on said semiconductor substrate;

forming an impurity doped metal silicide film on said gate insulation film; and irradiating energy beams to heat said silicide film, wherein said energy beams are incoherent light.

13. A method of manufacturing semiconductor devices, comprising:

forming element isolation regions in a semiconductor substrate;

forming a dummy gate insulation film in an element region surrounded by said element isolation regions;

forming a dummy gate electrode film on said dummy gate insulation film;

patterning said dummy gate electrode film to form a dummy gate electrode doping an impurity to form extension regions surrounding said element region by using said dummy gate electrode as a mask;

forming a sidewall insulation film on a side surface of said dummy gate electrode forming source and drain regions by doping an impurity into said element region by using said dummy gate electrode provided with said sidewall insulation as a mask;

covering said source and drain regions and said dummy gate with an interlayer insulation film;

making said interlayer insulation film substantially even to expose said dummy gate electrode;

eliminating said dummy gate electrode and said dummy gate insulation film to define a space;

forming a gate insulation film in said space on said semiconductor substrate;

forming an impurity doped metal silicide film on said gate insulation film; and irradiating energy beams to heat said silicide film, wherein said energy beams are incoherent light in a substantially visible region.

* * * * *